United States Patent [19]

Meyerand

[11] Patent Number: 5,150,052
[45] Date of Patent: Sep. 22, 1992

[54] APPARATUS AND METHOD FOR MAGNETIC RESONANCE SPECTRAL IMAGING

[76] Inventor: Mary E. Meyerand, 64 Littel Acres Rd., Glastonbury, Conn. 06033

[21] Appl. No.: 656,993

[22] Filed: Feb. 15, 1991

[51] Int. Cl.$^5$ .......................................... G01R 33/20
[52] U.S. Cl. .................................................. 324/309
[58] Field of Search ............... 324/300, 306, 307, 309, 324/310, 311, 312, 313, 314, 318, 322

[56] References Cited

U.S. PATENT DOCUMENTS

| | | | |
|---|---|---|---|
| 4,785,245 | 11/1988 | Lew et al. | 324/308 |
| 4,812,761 | 3/1989 | Vaughan, Jr. | 324/307 |
| 4,901,018 | 2/1990 | Lew | 324/306 |
| 4,983,920 | 1/1991 | Lampman et al. | 324/309 |
| 5,019,784 | 5/1991 | Garwood et al. | 324/307 |

OTHER PUBLICATIONS

Friedrich, J. O. & Freedman, R. "A Straddle-Coil in Vivo NMR", J. of Magnetic Resonance 68, pp. 582-587 (1968).

*Primary Examiner*—Michael J. Tokar
*Attorney, Agent, or Firm*—Fishman, Dionne & Cantor

[57] ABSTRACT

A method and apparatus for nuclear magnetic resonance imaging of NMR chemical spectra is disclosed. A chemically nonhomogeneous sample is placed within a static uniform magnetic field. A spatially uniform radio frequency excitation field $B_1$ is imposed on the sample at a nonzero angle relative to the static magnetic field. A spatially nonuniform radio frequency detection field is superimposed on the static magnetic fields in the same region as the excitation field. The spatially nonuniform radio frequency detection field has a cusp shape surrounding a point of negligible radio frequency detection sensitivity. The point of negligible radio frequency detection sensitivity is sequentially positioned at each of a plurality of different positions within the sample. Signals corresponding to radio frequency energy absorption or radiation by the sample volume at each position are detected. A spatial distribution of the chemical compounds within the sample is calculated based on the NMR spectra detected.

18 Claims, 5 Drawing Sheets

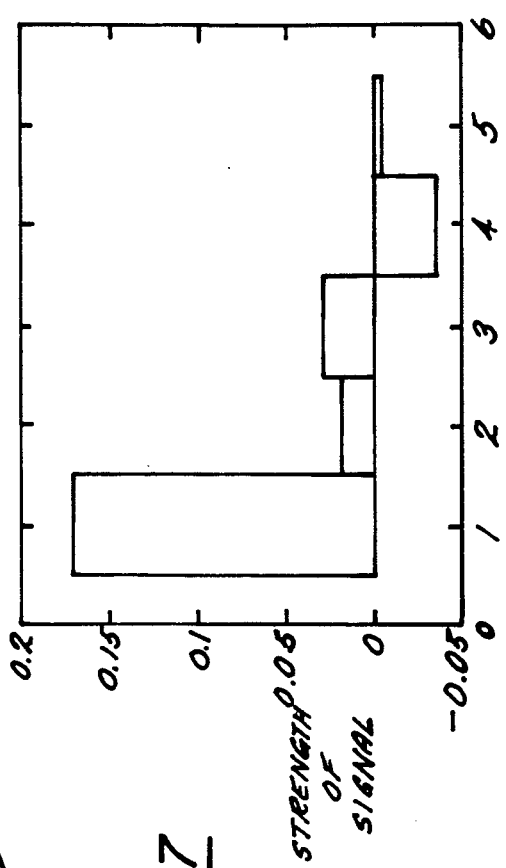
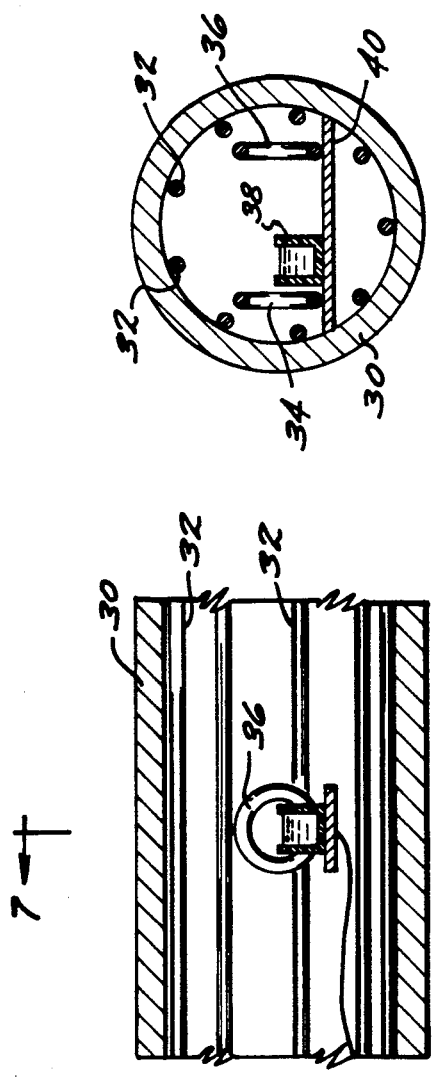

APPARATUS AND METHOD FOR MAGNETIC RESONANCE SPECTRAL IMAGING

TECHNICAL FIELD

The present invention is directed to the field of nuclear magnetic resonance spectroscopy and more particularly to Magnetic Resonance Imaging (MRI).

BACKGROUND

The atomic nuclei of certain elements exhibit angular momentum and an associated magnetic moment. When such nuclei are placed in a magnetic field they can adopt a number of quantized orientations, each orientation corresponding to a particular energy level. Nuclear magnetic resonance (NMR) involves transitions between these energy levels. The transitions may be induced by the absorption of radiation of a particular frequency. The absorption or emission of radiation may be detected to obtain a nuclear magnetic resonance spectrum of samples containing the certain elements.

Spatial information regarding the location of a region of interest is conventionally obtained using MRI by superimposing static magnetic field gradients, i.e. magnetic fields which change linearly in a given direction. The two dimensions perpendicular to each gradient field remain unresolved and one dimensional projection of the three dimensional sample are obtained. An image of the sample is mathematically reconstructed from the one dimensional projections. MRI has found widespread acceptance as a medical diagnostic technique for providing images of internal soft tissue structures of the human body. However, it must be recognized that the static magnetic field gradients that are essential to conventional imaging techniques make it impossible to resolve the NMR chemical spectrum of any compound in the volume under study. Simply put, the position of an NMR line which serves to identify the element in terms of a shift of so may ppm (parts per million) of magnetic field strength could be due to either a chemical shift of that element or the fact that the magnetic field has indeed changed by that amount due to the imposed magnetic field gradient employed by the imaging scheme.

SUMMARY OF THE INVENTION

A method for magnetic resonance imaging which does not involve a magnetic gradient in the static magnetic field is disclosed.

In a first embodiment of the method, a uniform static magnetic field $B_0$ is generated in a first direction. A sample volume is placed within the uniform static magnetic field. This sample which could be a human body will, in general, contain many different chemical compounds distributed throughout the volume in an unknown manner. In most cases, the different compounds are in such close proximity to one another within the sample volume, e.g. a mixture of compounds, that their spectra will overlap. Thus, it is not sufficient to determine the center of gravity of the chemical in space, but its complete spatial distribution including all maxima and minima must be obtained.

A spatially uniform radio frequency field $B_1$ is generated in a second direction to excite the sample volume. The second direction is oriented at a nonzero angle relative to the first direction. The receiving field comprises a spatially nonuniform radio frequency detection or excitation field oriented at a nonzero angle relative to the first direction and having a cusp shape surrounding a point at which the radio frequency field or its detection sensitivity is minimal. The point of minimal radio frequency field is sequentially positioned at a plurality of different positions within the sample volume. Energy absorption or radiation by the sample volume at each position is detected to obtain a spatial integral of the magnetic resonance spectra of the sample volume. Data analysis is used to resolve the location of each of the chemical species of the sample volume.

In a second embodiment, of the method, a uniform excitation pulse is applied to all regions of space, then a "dephasing" or "erasing" pulse is applied by the second nonuniform $B_1$ field and removes the NMR signal from all regions except the cusp point. An example of a dephasing pulse would be the application of a Rf noise pulse to the nonuniform Rf field coil in the shape of a cusp. This signal applied during the formation of a spin echo pulse will randomize the NMR spins and will prevent the formation of a spin echo at all spatial regions except for the point of the cusp.

If a spin echo is not being employed, a series of 90° pulses will remove free induction decay from all regions except at the point at the center of the cusp. The final signal is received using uniform detection coils (which could be the same set of coils that produced the initial uniform excitation). This signal will originate from the region of space that has not been effected by the dephasing pulse (where the center of the cusp was placed).

An apparatus for nuclear magnetic resonance imaging of chemical species is also disclosed.

A first embodiment of the apparatus includes means for generating a uniform magnetic field in a first direction, means for generating a spatially uniform radio frequency excitation field oriented in a second direction, wherein the second direction is oriented at a nonzero angle relative to the first direction and means for generating a spatially nonuniform radio frequency detection field oriented at a nonzero angle relative to the first direction. The detection field has a cusp shape and surrounds a point of minimal radio frequency detection sensitivity.

A second embodiment of the apparatus includes means for generating a spatially uniform radio frequency excitation field oriented in a second direction, wherein the second direction is oriented at a nonzero angle relative to the first direction and means for generating a spatially nonuniform radiofrequency field oriented at a nonzero angle relative to the first direction. The detection field has a cusp shape and surrounds a point of negligible radio frequency field strength.

BRIEF DESCRIPTION OF THE DRAWINGS

FIG. 6 shows a schematic longitudinal cross sectional view of an 1 experimental apparatus.

FIG. 7 shows a schematic transverse cross sectional view along line 7—7 in FIG. 6.

FIG. 8 shows a plot of experimentally determined sample distribution.

DETAILED DESCRIPTION OF THE INVENTION

Figure 2:
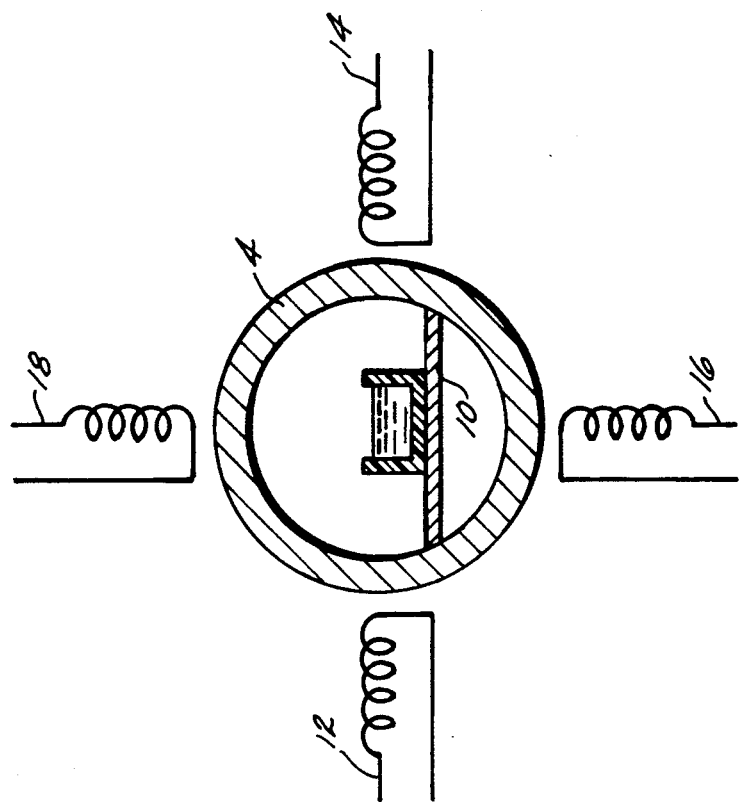
FIG. 2 shows a schematic transverse cross sectional view of the apparatus as shown in FIG. 1.
Figure 1:
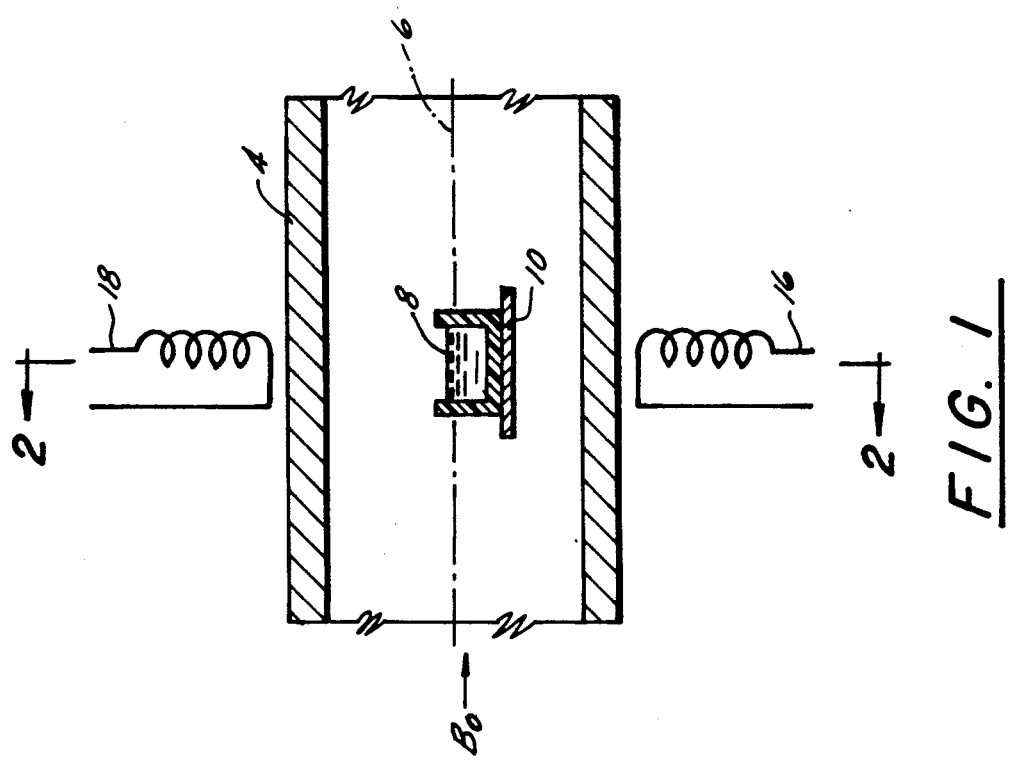
FIG. 1 shows a schematic longitudinal cross sectional view of one embodiment of the apparatus of the present invention.

FIG. 1 shows a schematic side view of an embodiment of the apparatus of the present invention and FIG. 2 shows a cross sectional view along line 2—2.

The apparatus shown in FIGS. 1 and 2 including a superconducting solenoid 4 extending along a first axis 6. The solenoid 4 generates a uniform magnetic field, $B_0$, oriented parallel to the first axis 6.

A sample volume 8 is located within the bore of the solenoid on a support 10 so that the first axis 6 passes through the sample volume.

A Pair of opposed excitation coils 12, 14 is provided for generating a uniform radio frequency excitation field, $B_1$ across the sample in a direction perpendicular to the field $B_0$. The solenoid 4 and excitation coils 12, 14 function in a conventional manner. The excitation provided by the excitation coils 12, 14 may be in the form of any arbitrary pulse sequence or multiple frequency excitation, e.g. COSY.

A pair of detection coils, 16, 18 are provided for generating a spatially nonuniform radio frequency detection field and detecting signals corresponding to energy absorption or radiation by the sample volume. The spatially nonuniform detection field is cusp shaped and surrounds a null or minimum point at which the detection sensitivity of the detection coils, 16, 18 is negligible. The cusped detection field is generated by directing current in one detection coil in the direction opposite the current flow in the other detection coil.

A formula for depicting a two dimensional representation of a cusped field for a pair of opposed coils, each of radius r and having equal and opposite current flow through each coil was developed and is set forth below:

$$H_t = \frac{i_1\, r^2}{2\,[(y+2r)^2 + r^2]^{1.5}} - \frac{i_2\, r^2}{2[(y-2r)^2 + r^2)]^{1.5}}$$

where:
$H_t$=total field
$i_1$=in first coil
$i_2$=current in second coil
r=radius of each coil, and
y=distance from coil.

Figure 3:
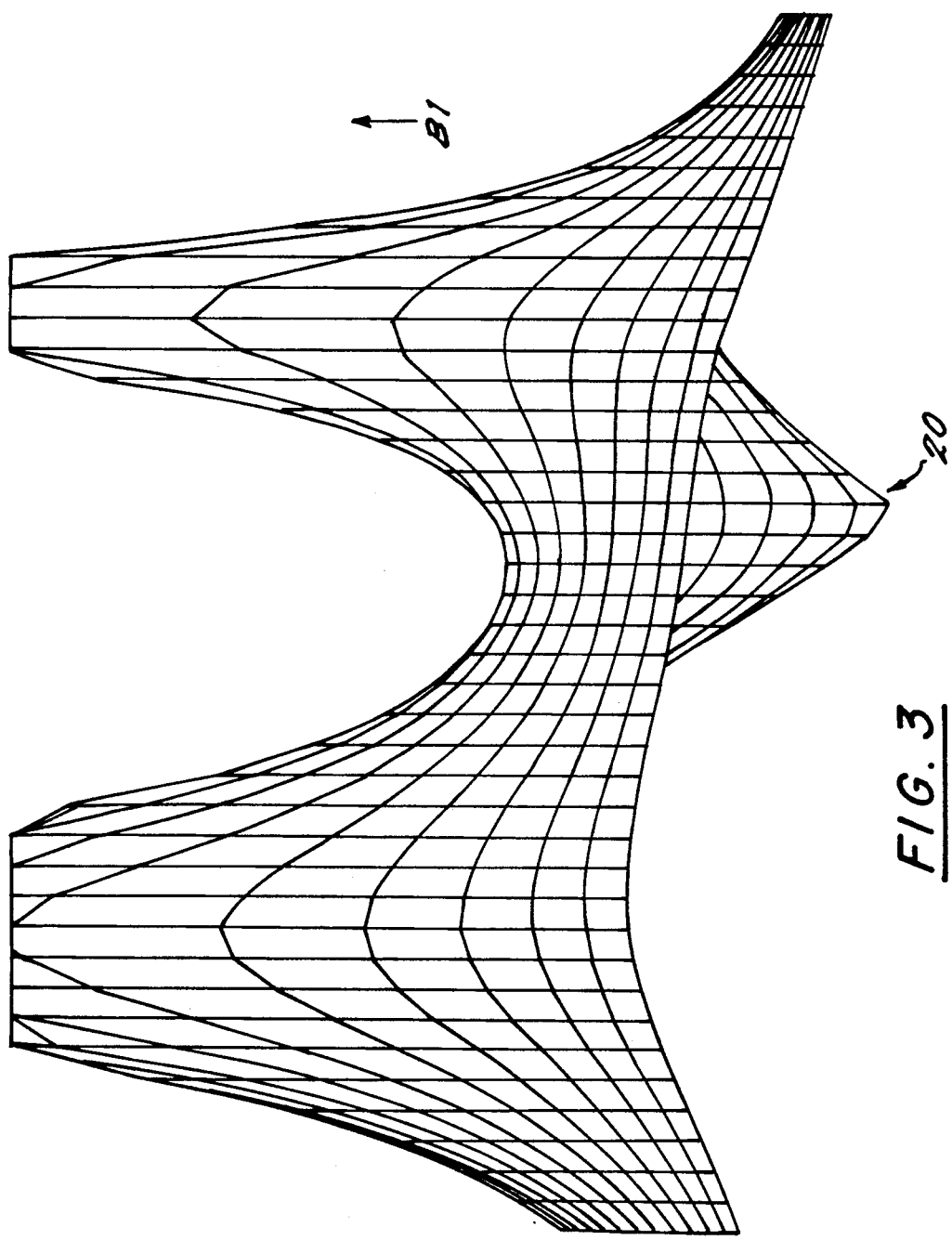
FIG. 3 shows a side view of a model of a spatially nonuniform radio frequency field.
Figure 4:
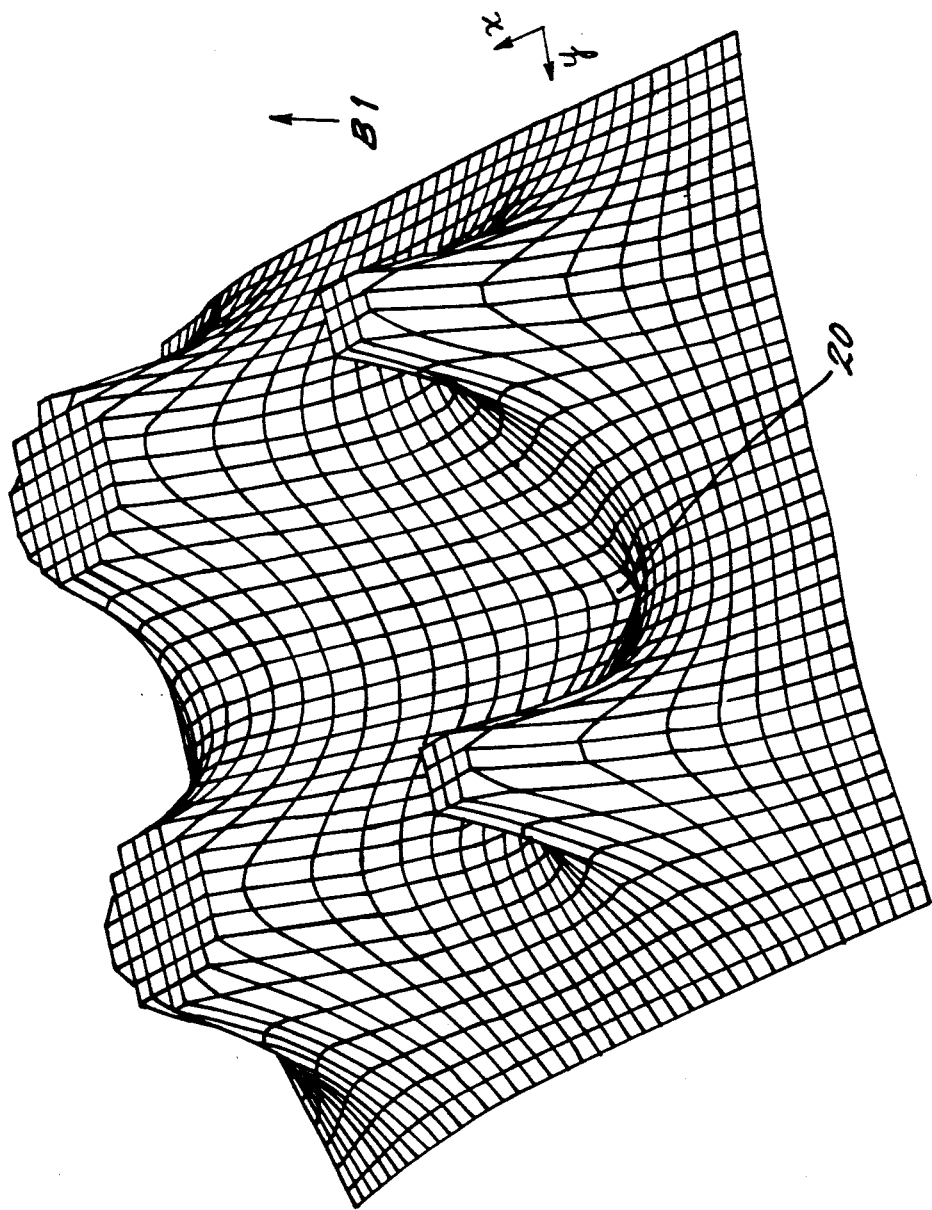
FIG. 4 shows a top perspective view of the model of FIG. 2.
Figure 5:
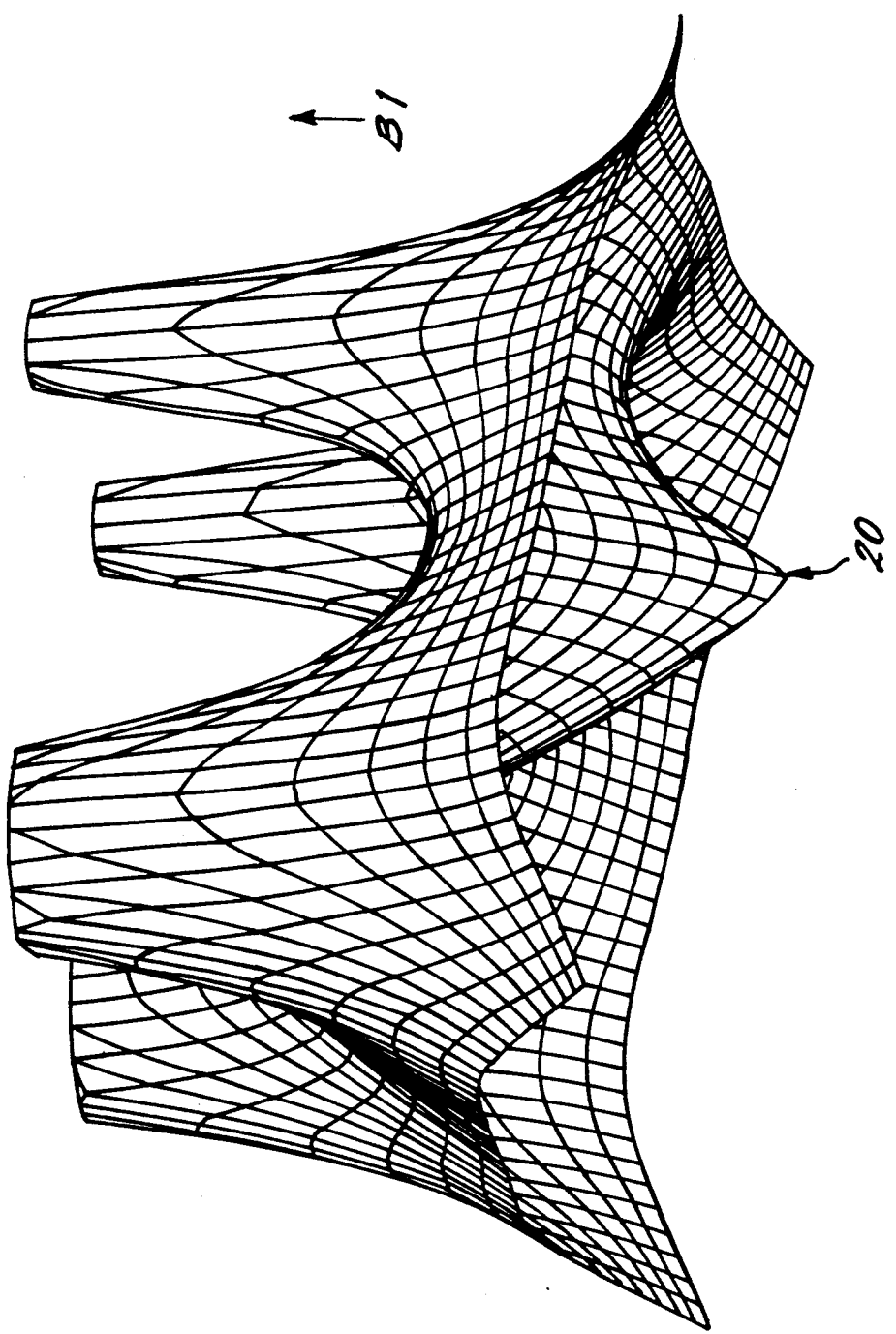
FIG. 5 shows a bottom perspective view of the model of FIG. 2.

FIGS. 3, 4 and 5 show side, top perspective and bottom perspective views, respectively, of a graphical representation of a cusped field generated using two opposed coils wherein the current in the first coil was in an opposite direction and equal to 2 times the current in the second coil. The graphs were constructed suing Matlab, a mathematics software package manufactured by the Math Works, Inc.

FIGS. 3, 4 and 5 each show a point 20 of negligible or minimum field. The position of the null point can be varied by attenuating the current in either of detection coils 16 and 18.

The field at point 20 will be negligible or very close to zero if the currents in the two coils are exactly opposite to one another, i.e. if a 180° phase difference exists between them. However, it is extremely significant that the proposed method will work with any phase difference between the currents in each coil. In a case of a phase difference other than 180°, point 20 will be a minimum and not necessarily zero or a negligible field strength.

When separate excitation and detection coils are used, it is preferable that the respective excitation or detection coils be detuned when their function is not required, i.e. the reception coil should be detuned during excitation and the excitation coiled should be detuned during reception.

Alternatively, a single pair of coils could be used for excitation and detection by providing a switching system for providing alternating excitation and detection modes.

The point of minimum radio frequency detection field is moved relative to the sample volume. The sample volume may be moved relative to a fixed point of negligible field or the point of negligible radio frequency detection field may be moved relative to a stationary sample by varying the relative attenuation of the current in the detection coils 16 and 18.

Since the signals detected by detection coils 12 and 14 are produced by the entire volume covered by the cusped field, the output of the detection coils 10 and 12 is an integrated signal over the volume covered by the cusped field. For a single pair of detection coils, i.e. a one dimensional experiment, the output may be described by an integral equation:

$$NMR_{absorption} \propto \int B(y)D(y)dy$$

The solution to the integral equation may be approximated by converting the equation to a finite sum with N terms and N unknown, i.e. an N-by-N matrix. The set of linear equations so generated can then be solved by making N measurements with the cusp in N different positions.

For example, for 5 sets of measurements each taken with the null point of the cusp at each of 5 positions, $B_n$, where n=1,2, ... 5, along a line between the coils.

$$A \approx \sum_{m=1}^{m=5} \sum_{n=1}^{n=5} B_{m,n}(y)\, D_n(y);$$

wherein:
m=cusp position, and
n=spatial position;

$$A_1 \approx \sum_{n=1}^{n=5} B_{1,n}(y)\, D_n(y);$$

$$A_2 \approx \sum_{n=1}^{n=5} B_{2,n}(y)\, D_n(y);$$

so that:

$$A_1 \approx B_{1,1}\, D_1 + B_{1,2}\, D_2 + B_{1,3}\, D_3$$
$$B_{1,4}\, D_4 + B_{1,5}\, D_5;\text{ and}$$

-continued $$\begin{bmatrix} A_1 \\ A_2 \\ A_3 \\ A_4 \\ A_5 \end{bmatrix} = \begin{bmatrix} B_{1,1} & B_{1,2} & B_{1,3} & B_{1,4} & B_{1,5} \\ B_{2,1} & B_{2,2} & B_{2,3} & B_{2,4} & B_{2,5} \\ B_{3,1} & B_{3,2} & B_{3,3} & B_{3,4} & B_{3,5} \\ B_{4,1} & B_{4,2} & B_{4,3} & B_{4,4} & B_{4,5} \\ B_{5,1} & B_{5,2} & B_{5,3} & B_{5,4} & B_{5,5} \end{bmatrix} \times \begin{bmatrix} D_1 \\ D_2 \\ D_3 \\ D_4 \\ D_5 \end{bmatrix}$$

Matrix B is a 5-by-5 matrix wherein a given row represents the strength of the $B_1$ magnetic field with the cusp in a given position along the line. Matrix D is the unknown distribution of sample material along the line. Matrix $A = B \times D$ and corresponds to the absorption or emission measurements taken in the experiment. Matrix $D = C \times A$, ($[C] = [A] - 1$) wherein Matrix C is the inverse of Matrix B. Inverting Matrix B can be accomplished by any number of mathematical techniques available in the literature. Once the inverse matrix has been determined it will hold for all experiments conducted with a particular set of coils so long as none of the coil dimensions are changed and the cusp is moved to the same locations. This fact is helpful since inverting a large matrix, e.g. $100 \times 100$ matrix, can require a considerable amount of time. Once the inverse is calculated however, solutions can be obtained by simple vector multiplication of any set of measurements with the previously determined inverse matrix, a rapid, straight forward process.

The above example is given for a one dimensional case, but two dimensional motion of the cusp can be produced using two sets of detection coils such as pairs of coils 12-14 and 16-18 in FIG. 2. Determining the spatial location of spectra in a $5 \times 5$ two dimensional array would result in a $25 \times 25$ matrix which could be solved in exactly the same manner as described above. The three dimensional case would employ a series of cusp coil pairs spaced along the axis of the magnet. A $5 \times 5$ three dimensional array would result in a $125 \times 125$ matrix which again could be solved using the matrix inversion techniques described above.

It should be noted that the matrices used in processing the data may be complex in form, i.e. both the magnitude of the NMR signal as well as the angle between the exciting and receiving pulses would be represented by a single complex value at each location in the matrix. It follows that the absorption signal from an unknown sample may also be complex, but the distribution values are real.

Solution of the above set of equations provides a spatial distribution of the NMR spectra with the sample volume. The information used in the data reduction need not be a simple peak height or number, but according to the present method the complete NMR spectra obtained with the null pointed at several different positions can be analyzed. After data reduction the spectra at any point may be obtained. This data can then be combined to yield a contour plot depicting the distribution of any of the chemical species of the sample volume in space, if desired.

Alternatively, a cusped Rf field may be used as a "dephasing" or "erasing" pulse. During the formation time of a spin echo an Rf noise signal or other disruptive sequence would be transmitted by the $B_1$ radiant coils. This disruptive signal randomizes the NMR spins and prevents the formation of a spin echo within the sample volume other than at the null point of the cusped disruptive field;

therefore the only signal remaining would be at the null point of the cusp where the disruptive field is zero or negligible. The position of the null point would be varied as in the previous method. Signals corresponding to Rf absorption or emission by the sample with the null point at each of a number of different positions would be detected by the uniform receiver coils to directly provide localized spectra. This technique would not require application of the above described matrix inversion data reduction technique to solve a integral equation.

EXAMPLE

A pair of coils were placed within the bore of the superconducting magnet 30 of a conventional NMR spectrometer according to the arrangement shown schematically in FIGS. 6 and 7. A conventional birdcage coil 32 was concentrically positioned with the bore of the magnet. A pair of $B_1$ gradient coils 34,36 was placed within the birdcage coil 32 and a sample 38 was placed on a support 40 between the $B_1$ gradient coils.

Each $B_1$ gradient coil 34, 36 consisted of a single 3 inch diameter loop of copper wire. The $B_1$ gradient coils 34, 36 were placed opposite each other and separated by a distance of 6 inches. The $B_0$ field produced by the magnet was shimmed according to conventional procedures to provide as homogeneous a $B_0$ field as possible.

A calibration matrix was constructed by exciting a calibration sample using a pulse sequence generated by the birdcage coil 32. The calibration sample consisted of about 1 ml water in a vial having a diameter of about 1 cm. The signal produced was received using the B1 gradient coils 34, 36.

Spectra were obtained with the sample placed at each of five different positions along an axis between the gradient coils 34, 36. The relative attenuation of the B1 gradient coils 34, 36 was adjusted to five different settings for each sample position to effectively move the null point of the B1 cusp to five different positions and thereby obtain five different spectra at each sample position. The results of the calibration provided the $5 \times 5$ calibration matrix, (MATRIX B) wherein:

| MATRIX B = | | | | |
| --- | --- | --- | --- | --- |
| 2105 | 1509 | 1374 | 1344 | 1420 |
| 1708 | 1329 | 1167 | 1186 | 1355 |
| 1405 | 1165 | 1067 | 1161 | 1712 |
| 1256 | 1101 | 1076 | 1231 | 1707 |
| 1171 | 1110 | 1159 | 1387 | 2078 |

A vial of water was placed in the first position. The null point of the B1 field is moved across the sample area by changing the relative attenuation the gradient coils 34, 36 to obtain a spectra or peak height/area value at each of the relative attenuation values used to generate the calibration matrix. The measurements provided a column matrix (MATRIX A) which when multiplied by the inverse of the calibration matrix (MATRIX C) yielded the sample distribution, i.e. in this simple experiment, position of the discrete sample relative to the gradient coils.

MATRIX C = INVERSE OF MATRIX B = $[B]^{-1}$

-continued

| 0.0062 | −0.0222 | 0.0044 | 0.0405 | −0.0267 |
| --- | --- | --- | --- | --- |
| −0.0113 | 0.0207 | −0.0012 | −0.0144 | 0.0917 |
| 0.0006 | 0.0463 | −0.0050 | −0.1439 | 0.0917 |
| 0.0027 | −0.0343 | −0.0050 | 0.1054 | −0.0620 |
| 0.0004 | −0.0015 | 0.0043 | −0.0052 | 0.0020 |

MATRIX A = EXPERIMENTAL DATA =

374.4100
303.0500
244.7600
215.8900
196.9100

SAMPLE DISTRIBUTION = MATRIX C * MATRIX A = MATRIX B 0.1710
0.0185
010289
−0.0354
−0.0040

Results are plotted in FIG. 8.

An additional advantage of the proposed method of gradientless imaging is the fact that induced currents resulting from gradient changes in $B_0$ which can distort the image in conventional techniques are not produced since $B_0$ is not required to change. This feature would be particularly important in situations that require very rapid imaging or where imaging is conducted in very strong $B_0$ fields. Thus the proposed method is not limited to chemical compound and spectrum localization, but may also provide superior conventional images under certain circumstances.

While preferred embodiments have been shown and described, various modifications and substitutions may be made thereto without departing from the spirit and scope of the invention. Accordingly, it is to be understood that the present invention has been described by way of illustrations and not limitations.

What is claimed is:

1. A method for magnetic resonance spectral imaging of sample volume, comprising:
    generating a uniform magnetic field in a first direction;
    placing the sample volume within the uniform magnetic field;
    generating a uniform radio frequency excitation field across a sample volume in a second direction, said second direction being oriented at a nonzero angle relative to the first direction;
    generating a first spatially nonuniform radio frequency detection field across the sample volume, said nonuniform field being oriented at a nonzero angle relative to the first direction and having a cusp shape surrounding a minimum point of minimal radio frequency detection sensitivity;
    sequentially positioning the minimum point in each of a plurality of different positions within the sample volume;
    detecting signals corresponding to radio frequency absorption or emission by the sample volume at each position of the plurality of positions;
    calculating spatially localized nuclear magnetic resonance chemical spectra within the sample volume from the signals detected.

2. The method of claim 1, wherein the spatially nonuniform radio frequency detection field is generated by applying electrical current to a pair of opposed spaced apart radio frequency coils, with a nonzero phase difference between the currents in the respective coils.

3. The method of claim 2 wherein minimum point is positioned by adjusting the relative current flow through the respective coils.

4. The method of claim 2, wherein the spatially localized nuclear magnetic resonance spectra are derived from the signals detected by matrix inversion of linear equations and solution of an integral equation describing the signals detected.

5. The method of claim 1, further comprising:
    generating a second spatially nonuniform radio frequency field oriented at a nonzero angle relative to the first direction and being oriented at a nonzero angle relative to the second direction so that spatially localized nuclear magnetic resonance spectra of the sample volume may be resolved in two dimensions.

6. The method of claim 5, wherein the first and second spatially nonuniform Rf fields are generated by a plurality of opposed pairs of radio frequency coils spaced apart along a central axis extending in the first direction so that spatially localized nuclear magnetic resonance chemical spectra may be obtained in three dimensions.

7. An apparatus for nuclear magnetic resonance spectral imaging of a sample volume, comprising:
    means for generating a uniform linear magnetic field in a first direction;
    means for generating a substantially spatially uniform radio frequency excitation field in a second direction; said second direction being oriented at a nonzero angle relative to the first direction;
    means for generating a first spatially nonuniform radio frequency detection field oriented in a direction oriented at a nonzero angle relative to the first direction and said nonuniform radio frequency detection field having a cusp shape surrounding a point of minimum radio frequency detection sensitivity; and
    means for positioning the point of minimum radio frequency detection sensitivity at a plurality of positions within the sample volume.

8. The apparatus of claim 7, wherein the means for generating the first spatially nonuniform radio frequency detection field comprises an opposed pair of radio frequency coils.

9. The apparatus of claim 8, wherein the means for positioning comprises means for adjusting relative current flow through the coils.

10. The apparatus of claim 7, further comprising:
    means for generating a second spatially nonuniform radio frequency field in a third direction, said third direction being oriented at a nonzero angle relative to the first direction and at a nonzero angle relative to the the second direction so that spatially localized nuclear magnetic resonance chemical spectra may be resolved in two dimensions.

11. The apparatus of claim 7, wherein the means for generating the first and second spatially nonuniform radio frequency fields comprise a plurality of opposed pairs of raid frequency coils spaced apart along a central axis extending in the first direction so that spatially localized nuclear magnetic resonance spectra may be obtained in three dimensions.

12. A method for magnetic resonance spectra imaging of a sample volume, comprising:

generating a uniform magnetic field in a first direction, placing a sample volume within the magnetic field;

generating a uniform radio frequency excitation field across the sample volume, said excitation field being oriented at a nonzero angle relative to the first direction;

generating a first spatially nonuniform radio frequency dephasing field, said dephasing field being oriented at a nonzero angle relative to the first direction and having a cusp shape surrounding a cusp point, said dephasing field disrupting nuclear magnetic resonance signals from all points other than the cusp point;

sequentially positioning the cusp point in each of a plurality of different positions with the sample value;

detecting signals corresponding to radio frequency absorption or emission by the sample volume at the dephasing cusp point at each position of the plurality of positions to obtain spatially localized nuclear magnetic resonance chemical spectra within the sample volume.

13. The method of claim 12, wherein the spatially nonuniform radio frequency dephasing field is generated by a pair of opposed spaced apart radio frequency coils, wherein the current flow through one coil of the pair of coils is 180° out of phase from the direction of current flow through the other coil of the pair of coils.

14. The method of claim 13, wherein the dephasing point is positioned by adjusting the relative current flow through the coils.

15. The method of claim 12 wherein the dephasing field comprises radio frequency noise pulses and is applied during formation of a spin echo pulse within the simple volume to randomize nuclear magnetic resonance spins within the single volume and prevent formation of a spin echo at all points within the single volume other than the cusp point.

16. The method of claim 12, wherein the dephasing field comprises a series of radio frequency noise pulses for removing free induction decay from all points within the sample volume other than the cusp point.

17. The method of claim 12, further comprising:

generating a second spatially nonuniform radio frequency dephasing field oriented at a nonzero angle relative to the first direction and at a nonzero angle relative to the second direction so that spatially localized magnetic resonance chemical spectra may be resolved in two dimensions.

18. The method of claim 12, wherein the first and second spatially nonuniform radio frequency dephasing fields are generated by a plurality of opposed pairs of radio frequency coils spaced apart along a central axis extending in the first direction, so that spatially localized nuclear magnetic resonance chemical spectra may be obtained in three dimensions.

* * * * *

UNITED STATES PATENT AND TRADEMARK OFFICE
CERTIFICATE OF CORRECTION

PATENT NO. : 5,150,052

DATED : September 22, 1992

INVENTORS : Mary E. Meyerand

It is certified that error appears in the above-identified patent and that said Letters Patent is hereby corrected as shown below:

Col. 2, line 68: Delete "1".

Col. 3, line 56: Delete "suing" and insert therefor --using--.

Col. 5, line 17: Delete " [C]=[A]-1 " and insert therefor -- $[C]=[B]^{-1}$ --.

Col. 5, line 63: Delete "Rf field" and insert therefor --Rf or $B_1$ field--.

Col. 5, line 66: Delete "radiant" and insert therefor --gradient--.

Col. 6, line 18: Delete "spectometer" and insert therefor --spectrometer--.

Col. 6, line 36: Delete "B1" and insert therefor -- $B_1$ --.

Col. 6, line 39: Delete "B1" and insert therefor -- $B_1$ --.

Col. 6, line 43: Delete "B1" and insert therefor -- $B_1$ --.

Col. 6, line 56: Delete "B1" and insert therefor -- $B_1$ --.

Col. 6, line 57: Insert --of-- after "attenuation".

Col. 7, line 17: Delete "010289" and insert therefor --0.0289--.

Col. 8, line 3: Insert --the-- after "wherein".

UNITED STATES PATENT AND TRADEMARK OFFICE
CERTIFICATE OF CORRECTION

PATENT NO. : 5,150,052

DATED : September 22, 1992

INVENTOR(S) : Mary E. Meyerand

It is certified that error appears in the above-identified patent and that said Letters Patent is hereby corrected as shown below:

Col. 8, line 63: Delete "raid" and insert therfor --radio--.

Signed and Sealed this

Thirtieth Day of November, 1993

Attest:

BRUCE LEHMAN

Attesting Officer

Commissioner of Patents and Trademarks